United States Patent
In-young (10) Patent No.: US 7,072,227 B2
(45) Date of Patent: Jul. 4, 2006

(54) CURRENT MODE OUTPUT DRIVER

(75) Inventor: Chung In-young, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 10/848,169

(22) Filed: May 19, 2004

(65) Prior Publication Data

US 2004/0233735 A1    Nov. 25, 2004

(30) Foreign Application Priority Data

May 22, 2003    (KR) .................. 10-2003-0032556

(51) Int. Cl.
*G11C 7/00* (2006.01)
(52) U.S. Cl. .................. 365/189.02; 365/198; 326/30; 326/82
(58) Field of Classification Search ....... 365/189.02 O, 365/189.08, 189.09, 198, 230.06; 327/530, 327/538; 326/30, 82
See application file for complete search history.

(56) References Cited

U.S. PATENT DOCUMENTS 6,366,155 B1 *   4/2002   Moon et al. .................. 327/530
6,567,317 B1 *   5/2003   Kwak .................... 365/189.02
6,577,554 B1 *   6/2003   Song et al. .................. 365/233

FOREIGN PATENT DOCUMENTS

KR    2000-0055937    9/2000

* cited by examiner

*Primary Examiner*—VanThu Nguyen
(74) *Attorney, Agent, or Firm*—Volentine Francos & Whitt, PLLC (57) ABSTRACT

A current mode output driver and output current control method of controlling an output current using a gate voltage are provided. The current mode output driver, which outputs data read from a memory core to a transmission line, includes a gate voltage control circuit, a bias circuit, and a driver circuit. The gate voltage control circuit generates a predetermined gate voltage in response to a current control signal. The bias circuit outputs the gate voltage as a first enable signal in an active mode, and outputs a ground voltage as a second enable signal in a standby mode. The driver circuit drives a predetermined output current in response to the first enable signal, outputs the predetermined output voltage to the transmission line according to the data, and stops its operation in response to the second enable signal. The gate voltage control circuit changes the level of the gate voltage according to a value of the current control signal and output the changed result. Therefore, it is possible to easily increase resolution of an output current and reduce the occupied area of the current mode output driver, thereby facilitating a circuit design.

11 Claims, 7 Drawing Sheets

CURRENT MODE OUTPUT DRIVER

BACKGROUND OF THE INVENTION

1. Field of the Invention

Embodiments of the present invention relate to a current mode output driver of a semiconductor memory device for adjusting an output current using a gate voltage and a method for adjusting an output current using the current mode output driver.

This application claims the priority of Korean Patent Application No. 2003-32556, filed on May 22, 2003, in the Korean Intellectual Property Office, the disclosure of which is incorporated herein in its entirety by reference.

2. Description of the Related Art

Figure 1:
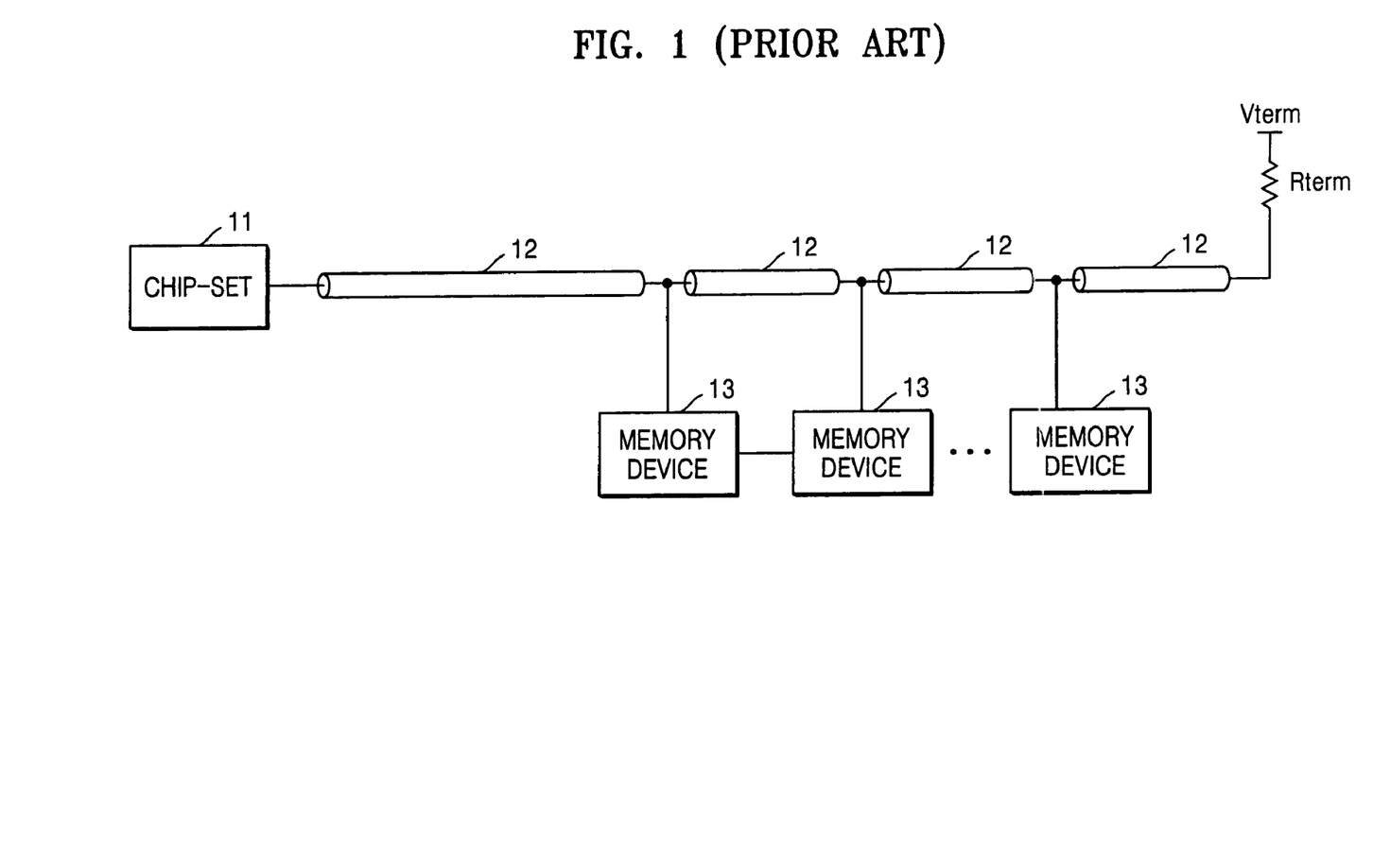
FIG. 1 is a view showing a connection of a general rambus DRAM and a chip set.

FIG. 1 shows a general data input/output interface of a semiconductor memory device, such as a rambus DRAM (hereinafter, referred to as 'RDRAM'). In FIG. 1, the plurality of memory devices 13 are connected to the chipset 11 through the transmission line 12. One end of the transmission line 12 is single-terminated by the terminating resistor Rterm and the terminating voltage Vterm.

Each of the plurality of memory devices 13 includes a current mode output driver for outputting data read from a memory outside the memory device 13. The current mode output driver has a large resistance both when it is turned on and when it is turned off, which facilitates impedance matching. Therefore, the current mode output driver is beneficial in RDRAM. The current mode output driver can also be used in systems for connecting chips to each other.

If the current mode output driver is a NMOS transistor, the voltage level at the gate terminal of the NMOS transistor is according to a data value read from the memory core. A drain current is generated from the NMOS transistor according to the voltage level at the gate terminal. This drain current is propagated through a channel or a wire. Since it is desirable for the current mode output driver to have a very large output resistance when it is in an on state, the NMOS transistor operates in saturation. Accordingly, the NMOS transistor should maintain a condition of "gate voltage (Vg)<drain voltage (Vd)+threshold voltage (Vt)".

If an internal voltage VDD is applied to the gate of the NMOS transistor and a lower voltage is generated at the drain of the NMOS transistor, the condition of "gate voltage (Vg)<drain voltage (Vd)+threshold voltage (Vt)" can not be maintained. Accordingly, the output resistance of the current mode output driver is significantly reduced. Accordingly, if the current mode output driver is a single NMOS transistor, it is preferable that an appropriate voltage VA with a value between the internal voltage VDD and the threshold voltage Vt is used as the gate voltage of the NMOS transistor. However, since the voltage VA having a large current supply ability should be generated inside the chip, an increase of chip area and current consumption occurs. Accordingly, various semiconductor devices, as well as RDRAM, use a stacked driver. A current mode output driver implemented by such a stacked driver is disclosed in U.S. Pat. No. 6,556,049.

Figure 2:
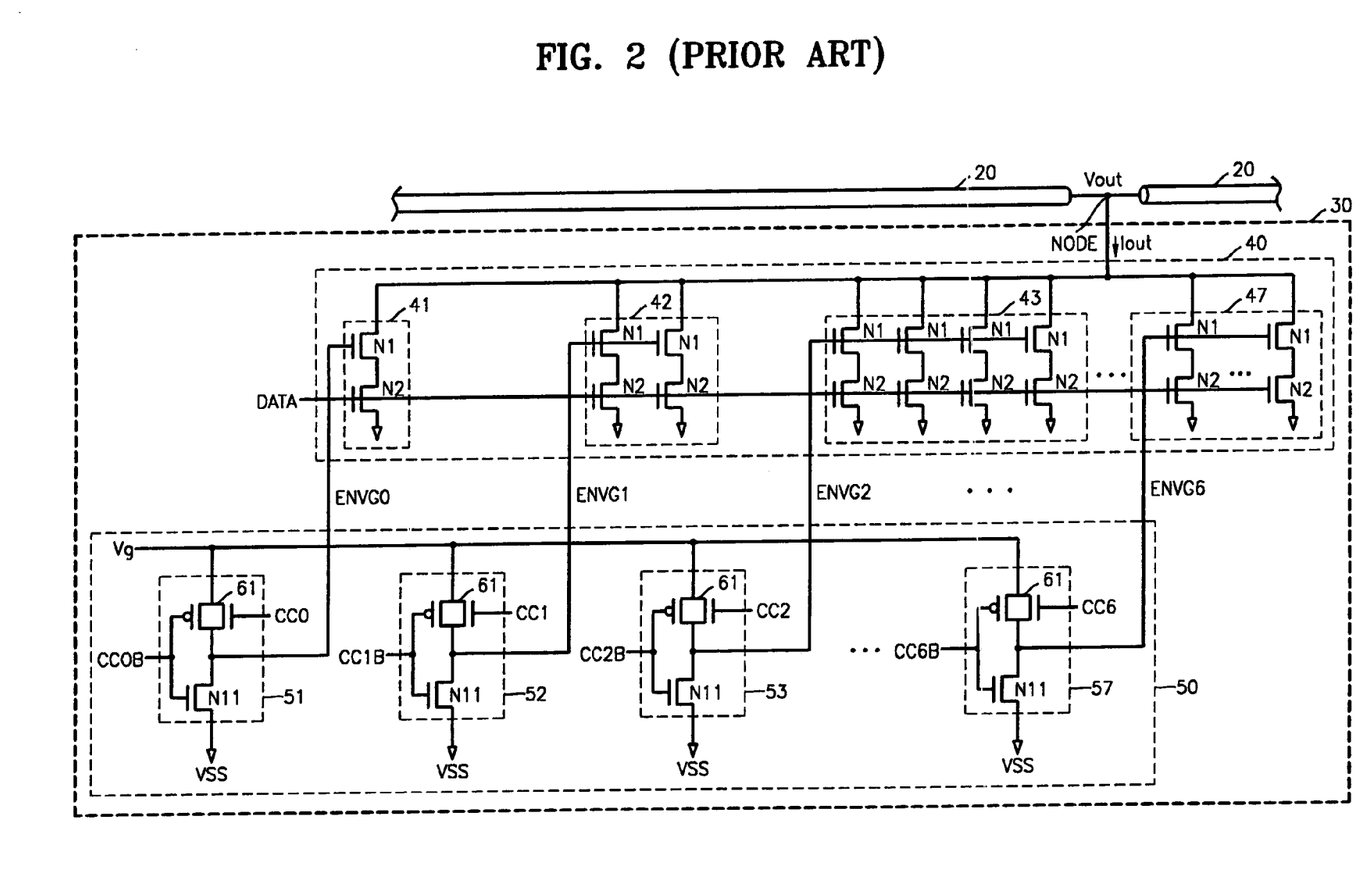
FIG. 2 is a circuit diagram illustrating a current mode output driver.

FIG. 2 is a circuit diagram of a current mode output driver, wherein the current mode output driver is used for a RDRAM. The current mode output driver 30 is connected to a transmission line 20 and generates a predetermined output voltage Vout on a node NODE according to data values. The current mode output driver 30 includes a driver circuit 40 and a bias circuit 50. The driver circuit 40 includes a plurality of driver segments 41 through 47 and the bias circuit 50 includes a plurality of bias circuits 51 through 57.

The plurality of bias circuits 51 through 57 output enable signals ENVG0 through ENVG6, respectively, to the plurality of driver segments 41 through 47, in response to received current control signals CC0 through CC6. Each of the current control signals CC0 through CC6 includes a predetermined number of bits. Each of the plurality of driver segments 41 through 47 includes $2^n$ stacked drivers, wherein n is a positive integer. The number of the stacked drivers included in each of the plurality of driver segments 41 through 47 are different. For example, the driver segment 41 includes a single driver, the driver segment 42 includes two drivers, and the driver segment 43 includes four drivers. Likewise, the number of the drivers included the driver segments 44 through 47 each respectively corresponds to $2^n$ and therefore the final driver segment 47 includes sixty-four drivers.

Each driver includes NMOS transistors N1 and N2. The source of the NMOS transistor N1 is connected to the drain of the NMOS transistor N2. The drain of the NMOS transistor N1 is connected to the node NODE. The enable signals ENVG0 through ENVG6 are input into the gate of the NMOS transistor N1. The source of the NMOS transistor N2 is connected to ground. Data DATA read from a memory core is input to the gate of NMOS transistor N2. The same enable signal is input into the gates of each the NMOS transistors N1 for a given driver segment. For example, the enable signal ENVG0 is input to the gate of one NMOS transistor N1 in the driver segment 41, while the enable signal ENVG1 is input into the gates of two NMOS transistors N1 in the driver segment 42. Likewise, the enable signal ENVG2 is input into four gates of the NMOS transistors N1 in the driver segment 43 and the enable signal ENVG6 is input into sixty-four gates of the NMOS transistors N1 in the driver segment 47.

The stacked driver of FIG. 2 has a large output resistance. The large output resistance is due to the NMOS transistors N1 operating in saturation, although the NMOS transistors N2 operates in a linearly and has a small resistance when data DATA of 1, (i.e. an internal voltage VDD) is inputted to the gate of the NMOS transistor N2. Since the enable signals ENVG0 through ENVG6 input into the gates of the NMOS transistors N1, have lower voltage levels than the internal voltage level VDD, the NMOS transistors N1 operate in saturation.

Each of the plurality of bias circuits 51 through 57 include the transmission gate 61 and the NMOS transistor N11. The drain of the NMOS transistor N11 is connected to an output terminal of the transmission gate 61. The source of the NMOS transistor N11 is connected to ground VSS. The current control signals CC0 through CC6 are input to the transmission gate 61. The opposite of CC0 through CC6 (CC0B through CC6B) are input into the gate of the NMOS transistor N11. The transmission gate 61 is turned on or off according to the current control signals CC0 through CC6. The transmission gate 61 receives a predetermined gate voltage Vg and outputs the gate voltage Vg as the enable signals ENVG0 through ENVG6 to an output terminal when it is turned on.

The NMOS transistor N11 is also turned on or off according to the current control signals CC0 through CC6. The NMOS transistor N11 is turned on when the transmission gate 61 is turned off, and outputs the ground voltage as the enable signal ENVG0 through ENVG6 to a drain terminal. The voltages of the enable signals ENVG0 through ENVG6 reaches the level of the gate voltage Vg or the level of the ground voltage VSS, in response to the current control signals CC0 through CC6. Accordingly, the NMOS transistors N1 in the plurality of driver segments 41 through 47 are turned on or off, according to the voltage levels of the enable signals ENVG0 through ENVG6.

The current mode output driver 30 allows a predetermined level of output current Iout to flow, so that a channel impedance matching condition of the transmission line 20 is satisfied, regardless of changes in temperature or voltage. Accordingly, the current mode output driver 30 checks the output current Iout continuously and adjusts the output current value Iout to maintain a constant current value. For example, in a RDRAM, when the current mode output driver 30 allows an output current Iout of 28.57 mA to flow and an output voltage Vout is varied between 1.8 V to 1.0 V by the output current Iout. The current mode output driver 30 checks whether the output voltage Vout is higher or lower than 1.0 V, and adjust the amount of the output current Iout.

The level of the output current Iout is controlled by the current control signals CC0 through CC6. For example, if the output voltage Vout is higher than 1.0 V, (i.e. the output current Iout is smaller than 28.57 mA), it is necessary to increase the value of the current control signals CC0 through CC6 by one bit. Likewise, if the output voltage Vout is lower than 1.0 V (i.e. the output current Iout is larger than 28.57 mA), it is necessary to reduce the value of the current control signal CC0 through CC6 by one bit. As the value of the current control signal CC0 through CC6 is changed, the voltage level of the enable signals ENVG0 through ENVG6 are also changed, controlling the number of the driver segments 41 through 47 turned on. As a result, the amount of the output current Iout is controlled.

In the RDRAM of FIG. 2, current control signals consist of seven bits and a current with $2^7$ (i.e., 128) levels are generated by the current control signal. For example, if it is assumed that a current control signal is '1001011', only the enable signals ENVG6, ENVG3, ENVG1, and ENVG0 reach the gate voltage Vg and the remaining enable signals ENVG2, ENVG4, and ENVG5 reach the ground voltage VSS. As a result, only the driver segments 47, 44 (not shown), 42, and 41 corresponding to $2^6$, $2^3$, $2^1$, and $2^0$ among seven driver segments 41 through 47 divided according to a ratio of $2^6:2^5:2^4:2^3:2^2:2^1:2^0$ are turned on, to output data DATA. In other words, only 75 drivers among the whole 127 drivers are turned on. In the method that adjusts the amount of the output current Iout by changing the number of the driver segments 41 through 47 turned on or off, the amount of the output current Iout is proportional to a value of the current control signal CC0 through CC6.

Figure 3:
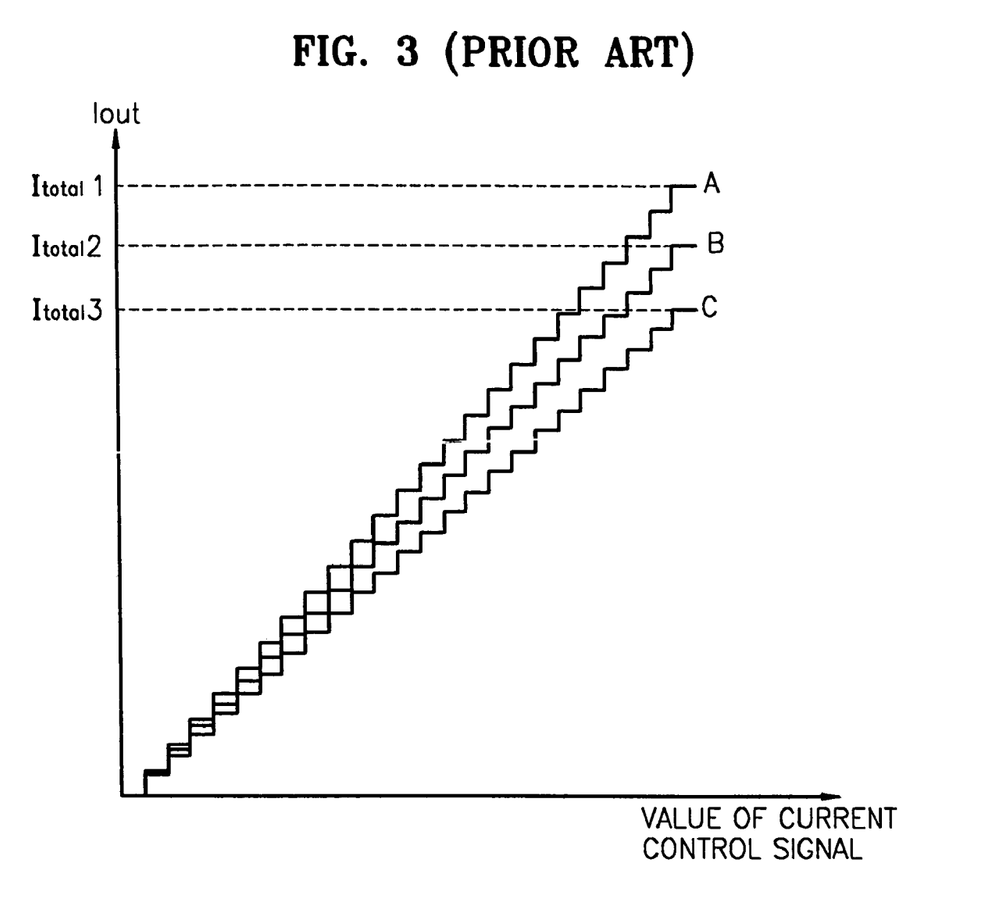
FIG. 3 is a plot illustrating a relationship between values of current control signals and output currents.

FIG. 3 is a plot showing a relationship between a value of a current control signal and an output current. In FIG. 3, reference symbols A, B, and C represent current control signals classified according to their bit numbers. In other words, the bit number of the current control signal in the case of C is larger than the current control signal in a case of B. Also, the bit number of the current control signal in the case of B is larger than the current control signal in the case of A. For example, the bit number of the current control signal can be seven in the case of A, eight in the case of B, and nine in the case of C. As it goes from the case A to the case C, resolution of the output current Iout increases. In FIG. 3, an amount of current adjusted by one driver is $I_{total}/127$, which corresponds to resolution of the output current Iout. When one driver is turned on or off, the amount of output current Iout is changed by $I_{total}/127$. In FIG. 3, resolutions of the output currents Iout for the cases A through C are $I_{total}3/127$, $I_{total}2/127$, and $I_{total}1/127$, respectively.

The current mode output driver 30 includes a bias circuit (e.g. bias circuits 51 through 57) and a signal line for supplying the enable signals ENVG0 through ENVG6 to each of the plurality of driver segments 41 through 47. Since the number of the current mode output drivers 30 included in one memory device is the same as the number of data input/output pins, signal lines corresponding to the number of the enable signals ENVG0 through ENVG6 must be wired to each of the driver segments of the plurality of current mode output drivers. Also, since the signal lines must be located with predetermined intervals from one another and relatively large capacitors must be connected to the signal lines in order to supply the enable signals ENVG1 through ENVG6 (each having a fine analog voltage), many difficulties exist in circuit design. Accordingly, since the current mode output driver 30 includes as many signal lines and bias circuits as the number of the enable signals ENVG0 through ENVG6, it occupies a very large area within a semiconductor chip. When increasing the bit number of the current control signal in order to increase resolution of the output current Iout, the current mode output driver 30 must include additional signal lines, bias circuits, and driver segments, which further increases the occupied area of the current mode output driver within the semiconductor chip.

SUMMARY OF THE INVENTION

Embodiments of the present invention provide a current mode output driver and an output current control method, capable of controlling the level of an output voltage by changing a gate voltage.

According to aspects of embodiments of the present invention, there is provided a current mode output driver, which outputs data read from a memory core to a transmission line. The current mode output driver may control an output current using a gate voltage. The current mode output driver may comprise the following. A gate voltage control circuit which generates a predetermined level of gate voltage in response to a current control signal. A bias circuit, which outputs the gate voltage as a first enable signal in an active mode and outputs a ground voltage as a second enable signal in a standby mode. And a driver circuit, which drives a predetermined output current in response to the first enable signal, outputs a predetermined output voltage to the transmission line according to the data, and/or stops its operation in response to the second enable signal. The gate voltage control circuit may change a level of the gate voltage according to a value of the current control signal and outputs the changed result.

According to aspects of embodiments of the present invention, there is provided a method of controlling an output current from a current mode output driver. The current mode output driver may include the following. A gate voltage control circuit which changes a level of a gate voltage according to a value of a current control signal and outputs the changed result. A bias circuit which outputs the gate voltage as a first enable signal in an active mode and outputs a ground voltage as a second enable signal in a standby mode. A driver circuit which drives a predetermined output current in response to the first enable signal and stops its operation in response to the second enable signal.

The method may comprise the following. A gate voltage control circuit, increasing the level of the gate voltage and outputting the increased result when the value of the current control signal increases in the active mode and increasing an output current driven by the driver circuit due to decrease of a turn-on resistance of the driver circuit according to increase of the level of the gate voltage. A gate voltage control circuit, decreasing the level of the gate voltage and outputting the decreased result when the value of the current control signal decreases in the active mode and decreasing the output current driven by the driver circuit due to increase of the turn-on resistance of the driver circuit according to decrease of the level of the gate voltage. The method further comprises repeating these steps until the active mode changes to standby mode.

DETAILED DESCRIPTION OF THE INVENTION

Figure 4:
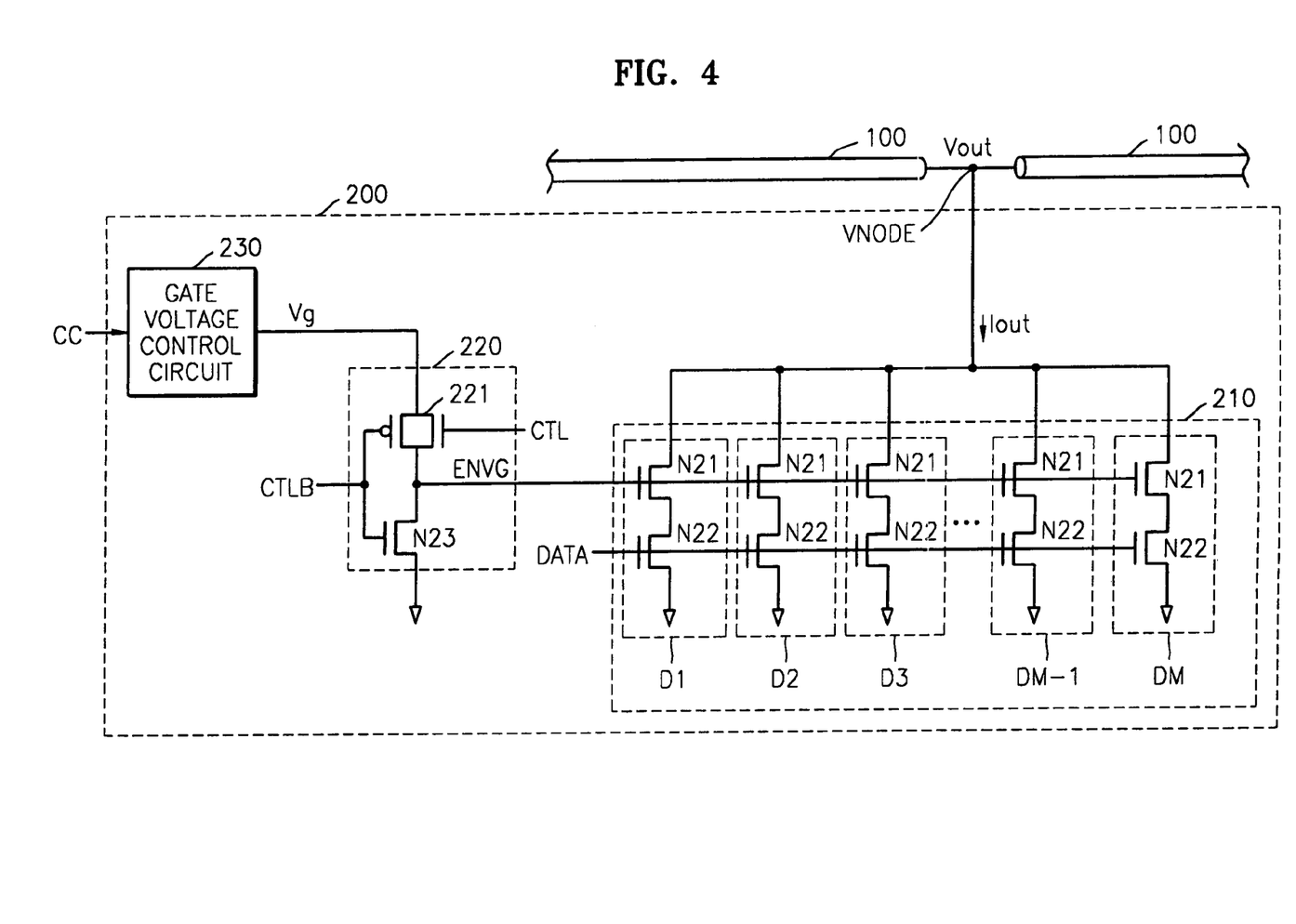
FIG. 4 is an exemplary circuit diagram of a current mode output driver.

FIG. 4 is an exemplary circuit diagram of a current mode output driver, according to embodiments of the present invention. Referring to FIG. 4, the current mode output driver 200 is connected to the node VNODE on the transmission line 100. The current mode output driver 200 comprises the driver circuit 210, the bias circuit 220, and the gate voltage control circuit 230.

The driver circuit 210 includes the plurality of parallel-connected drivers D1 through DM (M is a natural number more than two). The number of drivers included in the driver circuit 210 can be changed. Each of the plurality of drivers D1 through DM include two NMOS transistors N21 and N22. The source of the NMOS transistor N21 is connected to the drain of the NMOS transistor N22. The drain of the NMOS transistor N21 is connected to the node VNODE. The predetermined enable signal ENVG is input into the gate of the NMOS transistor N21. The source of the NMOS transistor N22 is connected to ground and the data DATA read from a memory core is input into the gate of the NMOS transistor N22.

The bias circuit 220 includes the transmission gate 221 and the NMOS transistor N23. The drain of the NMOS transistor N23 is connected to the output terminal of the transmission gate 221 and the source of the NMOS transistor N23 is connected to ground. The predetermined control signal CTL is input into the transmission gate 221 and the gate of the NMOS transistor N23. The control signal CTL is generated by a separate control circuit (not shown), and is enabled in an active mode and disabled in a standby mode. The transmission gate 221 that receives the predetermined gate voltage Vg, is turned on when the control signal CTL is enabled, and outputs the gate voltage Vg as the enable signal ENVG. The NMOS transistor N23 is turned on when the control signal CTL is disabled and outputs the ground voltage as the enable signal ENVG to the drain terminal.

The gate voltage control circuit 230 changes and outputs the level of the gate voltage Vg in response to a predetermined current control signal CC. The current control signal CC is generated by a separate control circuit (not shown) and includes a predetermined number of bits. The value of the current control signal CC is changed when the output current Iout of the current mode output driver 200 is changed.

The following describes exemplary operations of the current mode output driver 200. The control signal CTL is enabled in an active mode and the transmission gate 221 in the bias circuit 220 is turned on. The transmission gate 221 outputs a gate voltage Vg with a predetermined voltage level as the enable signal ENVG. The plurality of drivers D1 through DM in the driver circuit 210 are turned on in response to the enable signal ENVG and generate a predetermined output voltage Vout on the node VNODE, according to a value of data DATA read from the memory core.

If the output voltage Vout is higher than a predetermined voltage level, the value of the current control signal CC increases by one bit. The gate voltage control circuit 230 increases and outputs the level of the gate voltage Vg in response to the current control signal CC. As the level of the gate voltage Vg increases, the voltage level of the enable signal ENVG also increases. As the voltage level of the enable signal ENVG increases, the turn-on resistance of the NMOS transistor N21 in each of the plurality of drivers D1 through DM decreases. As a result, the amount of current flowing through the plurality of drivers D1 through DM increases, which increases the amount of the output current Iout.

If the output voltage Vout is lower than the predetermined voltage level, the value of the current control signal CC decreases by one bit. The gate voltage control circuit 230 reduces and outputs the level of the gate voltage Vg in response to the current control signal CC. As the level of the gate voltage Vg decreases, the voltage level of the enable signal ENVG also decreases. As the voltage level of the enable signal ENVG decreases, the turn-on resistance of each of the NMOS transistors N21 in the plurality of drivers D1 through DM increases. Accordingly, the amount of current flowing through the plurality of drivers D1 through DM decreases, which decreases the amount of the output current Iout.

Figure 8:
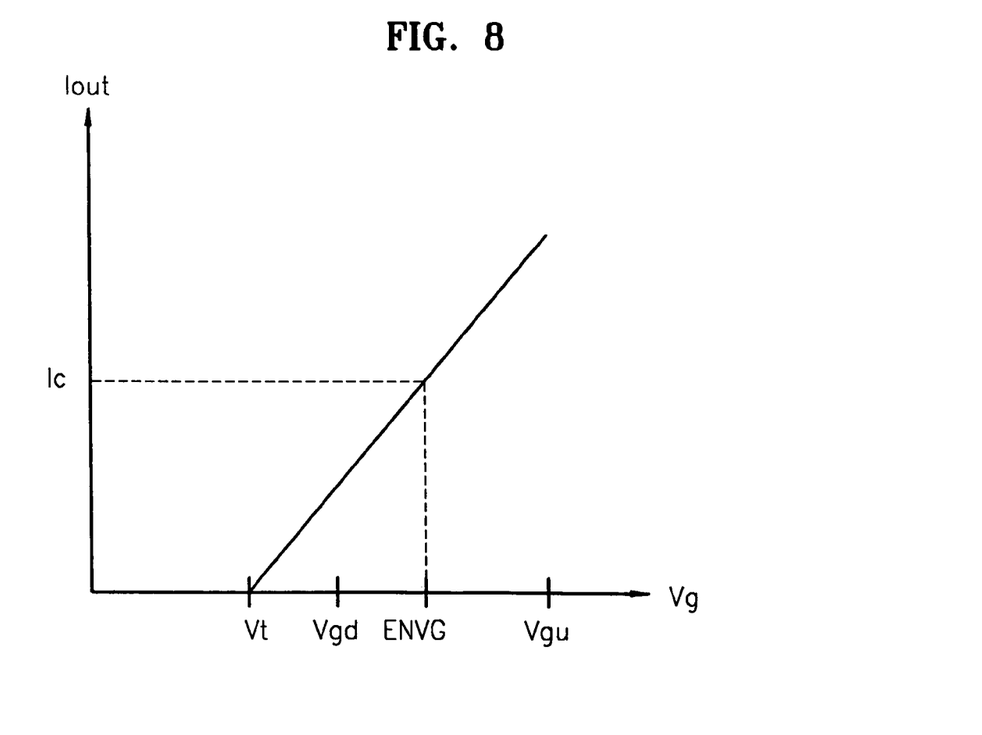
FIG. 8 is an exemplary plot illustrating a relationship between the gate voltage and an output current, in a current mode output driver.

As illustrated in exemplary FIG. 8, the output current Iout is proportional to the gate voltage Vg. Vt represents a threshold voltage of the NMOS transistor N21. Vgd represents the minimum level of the gate voltage Vg. Vgu represents the maximum level of the gate voltage Vg. Ic represents an exemplary ideal amount of the output current Iout. The voltage level of the enable signal ENVG (appearing when the amount of the output current Iout is Ic exists) is between the gate voltage Vgd and the gate voltage Vgu. When active mode changes to standby mode, the control signal CTL is disabled. The transmission gate 221 in the bias circuit 220 is turned off and the NMOS transistor N23 is turned on in response to the control signal CTL, thereby outputting to the drain the enable signal ENVG with a ground voltage level. The plurality of drivers D1 through DM are turned off in response to the enable signal ENVG and stop outputting the data DATA.

The current mode output driver 200, according to embodiments of the present invention, changes the level of the gate voltage Vg and controls the amount of the output current Iout. Accordingly, the current mode output driver 200 may include only one bias circuit and one signal line for supplying an enable signal ENVG in the driver circuit 210. The current mode output driver 200 may not need to divide the drivers D1 through DM, included in the driver circuit 210, according to the bit number of the current control signal. Therefore, the number of the drivers D1 through DM included in the driver circuit 210 is flexible.

Figure 5:
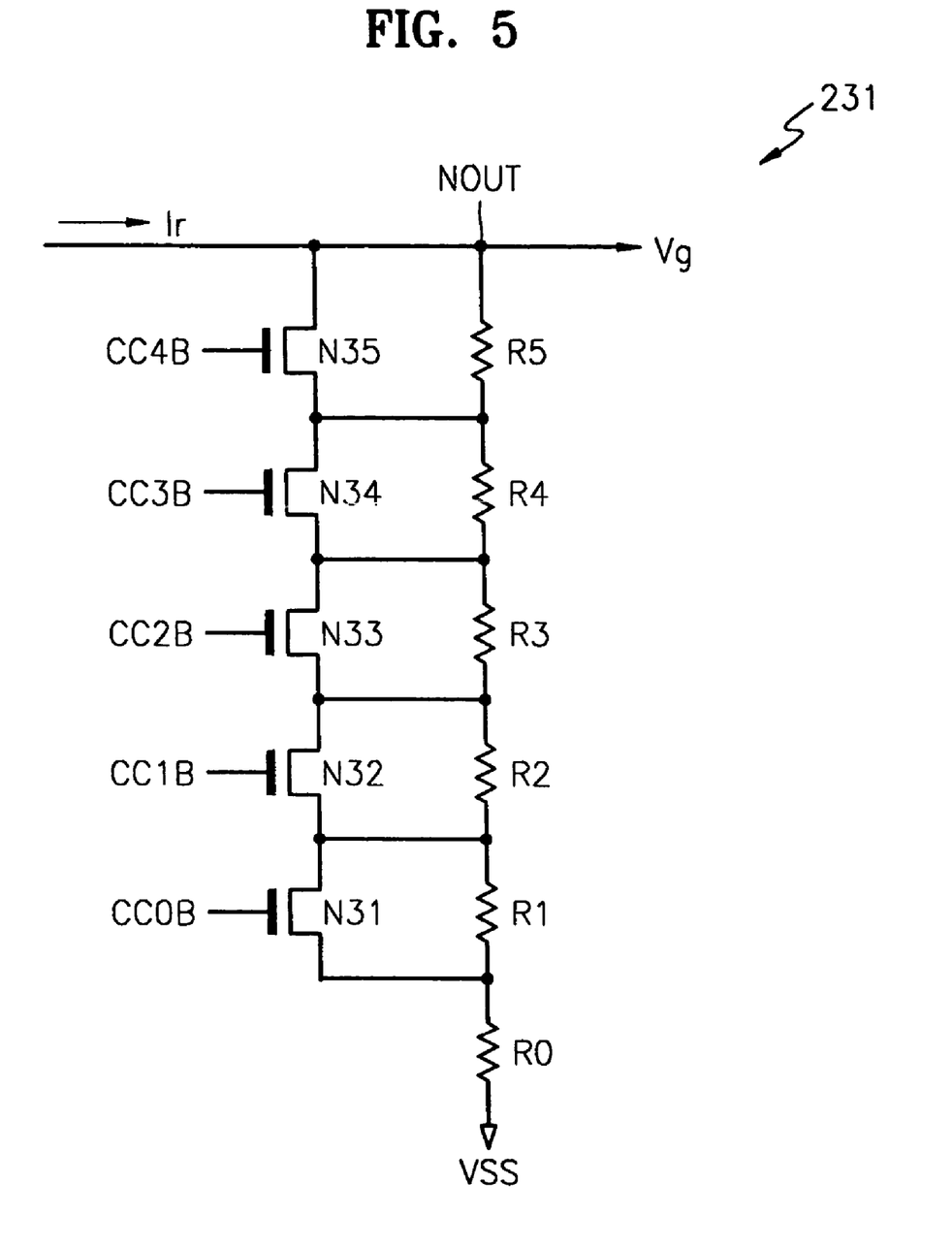
FIGS. 5 and 6 are exemplary circuit diagrams showing a gate voltage control circuit.

FIG. 5 is an exemplary circuit diagram showing a gate voltage control circuit, according to embodiments of the present invention. The gate voltage control circuit 231 may comprise a plurality of resistors R0 through R5 and a plurality of switching circuits N31 through N35. The plurality of resistors R0 through R5 are connected in series to each other. For example, one end of the resistor R5 is connected to a node NOUT and one end of the resistor R0 is connected to a ground voltage VSS. Here, the resistances of each of the plurality of resistors R0 through R5 can be different or the same. In embodiments, the resistances of the resistors R1 through R5 can be predetermined multiples of the resistance of the resistor R0. Also, the resistance values of the predetermined multiples may increase in the order of the resistors R1, R2, R3, R4, and R5.

The plurality of switching circuits N31 through N35 are connected in parallel to both ends of each of the plurality of resistors R1 through R5, respectively. Each of the plurality of switching circuits N31 and N35 may be a NMOS transistor. An example of the plurality of switching circuits N31 and N35 are NMOS transistors shown in FIG. 5. The drain and source of each of the NMOS transistors N31 through N35 are connected to both ends of each of the plurality of resistors. Complementary signals CC4B through CC0B of the current control signals are input into the gate of each of NMOS transistors N35 through N31, respectively. The NMOS transistors N35 and N31 are turned on or off in response to the complementary signals CC4B through CC0B of the current control signals. A predetermined value of current Ir is input into the node NOUT. The level of the gate voltage Vg output from the node NOUT changes according to a resistance resulting from the combination of the NMOS transistors N31 through N35 that are turned on or off. The resistor R0 is a resistor for generating a minimal gate voltage Vg on the node NOUT when all the NMOS transistors N31 through N35 are turned on.

The operations of the gate voltage control circuit 231 is exemplified as follows. If the complementary signals CC4B through CC0B of the current control signals are '11111', all the NMOS transistors N31 through N35 are turned on and a gate voltage Vg generated by the current Ir and the resistor R0 is output to the node NOUT. If the complementary signals CC4B through CC0B of the current control signals are '10100', the NMOS transistors N35 and N33 are turned on and the NMOS transistors N34, N32, and N31 are turned off. As a result, a gate voltage Vg generated by the current Ir and the resistors R0, R1, R2, and R4 is outputted to the node NOUT.

Figure 7:
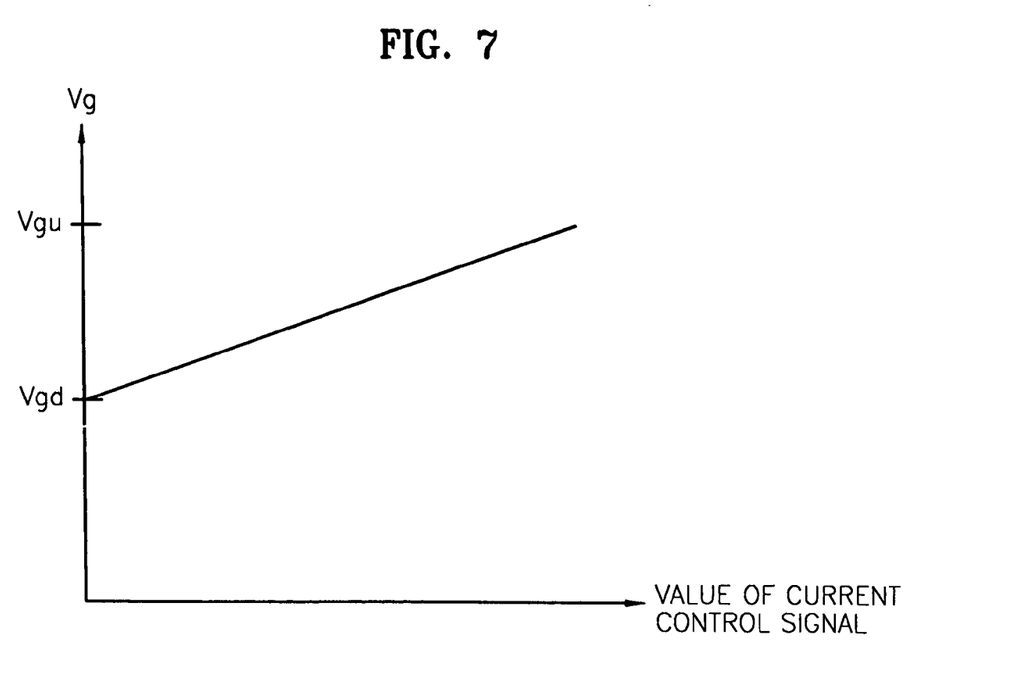
FIG. 7 is an exemplary plot illustrating a relationship between a value of current control signal and a gate voltage, in a current mode output driver.

The level of the gate voltage Vg can be controlled according to the change in the values of the current control signals CC4 through CC0. Referring to exemplary FIG. 7, the gate voltage Vg may be proportional to the value of the current control signal. In FIG. 7, Vgd represents the minimum level of the gate voltage Vg and Vgu represents the maximum level of the gate voltage Vg. Here, if the current control signals CC4 through CC0 are '00000', the gate voltage Vg are generated by the current Ir and the resistor R0 to reach the minimum level Vgd.

If an output voltage Vout of the current mode output driver 200 of FIG. 4 is higher than a predetermined voltage level, the values of the current control signals CC4 through CC0 increase. If the values of the current control signals CC4 through CC0 increase, the gate voltage control circuit 231 increases the resistance of the resistor through which the current Ir flows. As a result, the level of the gate voltage Vg outputted from the gate voltage control circuit 231 increases.

If the level of the output voltage Vout of the current mode output driver 200 is lower than the predetermined voltage level, the values of the current control signals CC4 through CC0 decrease. If the values of the current control signals CC4 through CC0 decrease, the gate voltage control circuit 231 reduces the resistance of the resistor through which the current Ir flows, and reduces and outputs the level of the gate voltage Vg.

In FIG. 5, the plurality of resistors R0 through R5 and the plurality of NMOS transistors N31 and N35 are exemplary. Accordingly, the number of the NMOS transistors and the resistors included in the gate voltage control circuit 231 can be different. The gate voltage control circuit 231 may include the same number of resistors and NMOS transistors as the bit number of the current control signal. As the number of the resistors and NMOS transistors included in the gate voltage control circuit 231 increases, resolution of the output current Iout of the current mode output driver (200 of FIG. 4) also increases. The current mode output driver, according to embodiments of the present invention, may increase resolution of the output current by adding only a switching circuit and resistors in the gate voltage control circuit. Accordingly, it is possible to reduce the occupied area of the current mode output driver.

Figure 6:
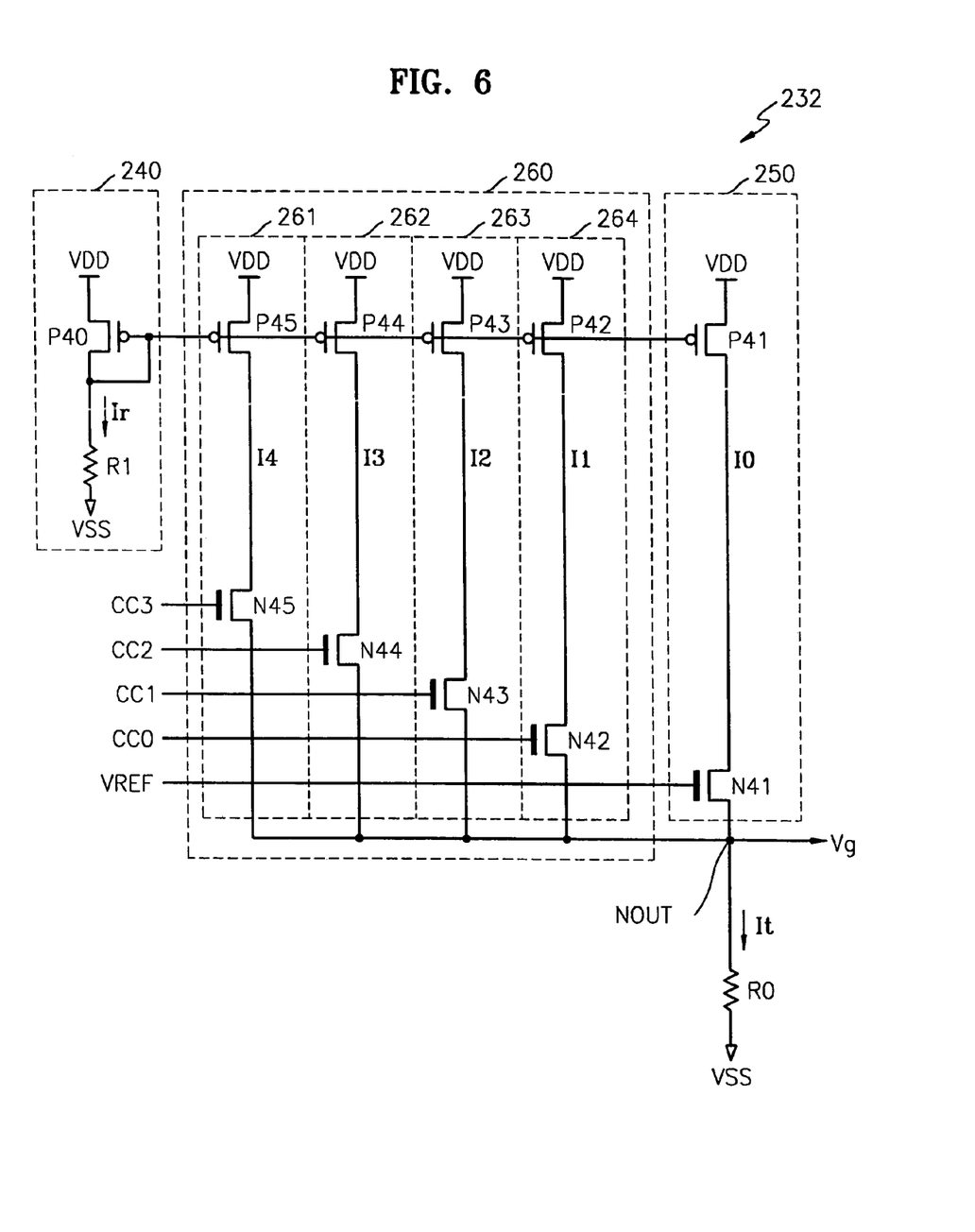

FIG. 6 is an exemplary circuit diagram showing a gate voltage control circuit, according to embodiments of the present invention. The gate voltage control circuit 232 comprises the reference current source circuit 240, the first current source circuit 250, the additional current source circuit 260, and/or the resistor R0. The reference current source circuit 240 generates a predetermined reference current Ir. The reference current source circuit 240 may include the PMOS transistor P40 and a resistor R1. The source of the PMOS transistor P40 is connected to an internal voltage VDD. The gate and drain of the PMOS transistor P40 are connected to one end of the resistor R1 and the other end of the resistor R1 is connected to the ground voltage VSS. The first current source circuit 250 forms a current mirror with the reference current source circuit 240, and generates and outputs a first current I0 to a node NOUT. The first current source circuit 250 may include the PMOS transistor P41 and a NMOS transistor N41.

The additional current source circuit 260 may be connected in parallel to the first current source circuit 250 and may form a current mirror with the reference current source circuit 240. The additional current source circuit 260 may include a first through a second additional current source circuits 261 through 264. The first through the second additional current source circuits 261 through 264 generate and output predetermined additional currents I4 through I1 to the node NOUT, in response to predetermined current control signals CC3 through CC0. The first through the second additional current source circuits 261 through 264 may include PMOS transistors P45 through P42 acting as current sources and NMOS transistors N45 through N42 acting as switching circuits.

One end of the resistor R0 may be connected to the node NOUT and the other end may be connected to the ground voltage VSS. The resistor R0 passes the current It to the node NOUT and generates a predetermined level of gate voltage Vg on the node NOUT. For example, the current It is a sum of the first current I0 and the additional currents I4 through I1.

The sources of the PMOS transistors P45 through P41 are connected to the internal voltage VDD. The gates of the PMOS transistors P45 through P41 are connected to one end of the resistor R1 and to the gate of the PMOS transistor P40. The drains of the PMOS transistors P45 through P41 are connected to the drains of the NMOS transistors N45 through N41, respectively. The current control signals CC3 through CC0 are input to the gates of the NMOS transistors N45 through N42, respectively. The sources of NMOS transistors N45 through N42 are connected to the node NOUT. A predetermined reference voltage VREF is input to the gate of the NMOS transistor N41 and the source of the NMOS transistor N41 is connected to the node NOUT. Here, when the gate voltage control circuit 232 operates, the reference voltage VREF maintains the NMOS transistor N41 in an always turned-on state.

When the NMOS transistor N41 is turned on, a predetermined current I0 flows through the PMOS transistor P41, the NMOS transistor N41, and the resistor R0. The gate voltage Vg generated by the current I0 and the resistor R0 appears on the node NOUT. The PMOS transistor P41 and the NMOS transistor N41 are provided to generate a minimum gate voltage Vg on the node NOUT when all the NMOS transistors N45 through N42 are in a turned-off state. The NMOS transistors N45 through N42 are turned on or off in response to the current control signals CC3 through CC0. The PMOS transistors P45 through P42 have different current driving capacities and drive the different amounts of the additional currents I4 through I1 when the NMOS transistors N45 though N42 are turned on.

The additional currents I4 through I1 is a predetermined multiple of the reference current Ir. For example, additional current I4 can be set to multiple of eight of the reference current Ir and the additional current I3 can be set to multiple of four of the reference current Ir. Likewise, the additional current I2 can be set as double the reference current Ir, and the additional current I1 can be set equal to the reference current Ir. Here, a ratio of the additional currents I4 through I1 to the reference current Ir can be flexibly set.

As the number of the turned-on NMOS transistors N45 through N42 increases, the amount of the current It flowing to the node NOUT increases. Accordingly, the level of the gate voltage Vg generated on the node NOUT increases. Likewise, as the number of the turned-off NMOS transistors N45 through N42 increases, the amount of the current It flowing to the node NOUT decreases. As a result, the level of the gate voltage Vg generated on the node NOUT decreases.

As an example, if the current control signals CC3 through CC0 are '0000', all the NMOS transistors N45 through N42 of the additional current source circuit 260 are turned off. The NMOS transistor N41 of the first current source circuit 250 is turned on in response to a reference voltage VREF and a first current I0 flows to the node NOUT. The current It reaches the first current I0 and a gate voltage Vg generated by the first current I0 and the resistor R0 is output to the node NOUT.

As another example, if the current control signals CC3 through CC0 are '0011', only the NMOS transistors N43 and N42 of the additional current source circuit 260 are turned on and the NMOS transistors N45 and N44 are turned off. As a result, the first current I0 and the additional currents I1 and I2 flow to the node NOUT and the amount of the current It increases. If the amount of the current It increases, the level of the gate voltage Vg generated on the node NOUT increases. Accordingly, the level of the gate voltage Vg can be controlled by changes in values of the current control signals CC3 through CC0.

If the output voltage Vout of the current mode output driver (200 of FIG. 4) is higher than a predetermined voltage level, the values of the current control signals CC3 through CC0 increase. If the values of the current control signals CC3 through CC0 increase, the gate voltage control circuit 232 increases the amount of the current It flowing to the resistor R0. As a result, the level of the gate voltage Vg outputted from the gate voltage control circuit 232 increases.

If the output voltage Vout of the current mode output driver 200 is lower than the predetermined voltage level, the values of the current control signals CC3 through CC0 decrease. If the values of the current control signals CC3 through CC0 decrease, the gate voltage control circuit 232 increases the current It flowing to the resistor R0, and reduces and outputs the level of the gate voltage Vg.

The gate voltage control circuit 232 is illustrated in FIG. 6 to include the first through the fourth additional current source circuits 261 through 264. However, the number of the additional current source circuits is flexible. In more detail, the gate voltage control circuit 232 can include the same number of additional current source circuits as the bit number of the current control signal. As the number of the additional current source circuits included in the gate voltage control circuit 232 increase, resolution of the output current Iout of the current mode output driver (200 of FIG. 4) increases.

Accordingly, since the current mode output driver according to embodiments of the present invention can increase resolution of an output current only by adding additional current source circuits in the gate voltage control circuit, it is possible to reduce the occupied area of the current mode output driver and facilitate a circuit design. Accordingly, it may be possible to increase resolution of an output current. Also, it may be possible to facilitate a circuit design by reducing the occupied area of the current mode output driver.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A current mode output driver wherein:
   the current mode output driver outputs data read from a memory core to a transmission line;
   the current mode output driver controls an output current using a gate voltage; and
   the current mode output driver comprises:
      a gate voltage control circuit which generates a predetermined level of gate voltage in response to a current control signal, wherein the gate voltage control circuit changes a level of the gate voltage according to a value of the current control signal;
      a bias circuit, which outputs the gate voltage as a first enable signal in an active mode and outputs a ground voltage as a second enable signal in a standby mode; and
      a driver circuit which drives a predetermined output current in response to the first enable signal, outputs a predetermined output voltage to the transmission line according to the data, and stops its operation in response to the second enable signal.

2. The current mode output driver of claim 1, wherein the driver circuit includes a plurality of stacked drivers each having two NMOS transistors.

3. The current mode output driver of claim 1, wherein the current control signal includes a predetermined number of bits, and values of the bits increase when the output voltage is higher than a predetermined voltage level and decrease when the output voltage is lower than the predetermined voltage level, and the gate voltage control circuit increases a level of the gate voltage as the bit values of the current control signal increase and decreases the level of the gate voltage as the bit values of the current control signal decrease.

4. The current mode output driver of claim 3, wherein the gate voltage control circuit comprises:

a reference resistor which has a reference resistance, which passes a predetermined amount of reference current, and which generates a minimal level of gate voltage on an output node;

a plurality of resistors which are connected in serial between the output node and the reference resistor and have predetermined resistances; and a plurality of switching circuits, which are connected to both ends of each of the plurality of resistors, respectively, and are turned on or off in response to the current control signal, wherein the plurality of resistors pass the reference current and increase the level of the gate voltage when the switching circuits are turned off.

5. The current mode output driver of claim 4, wherein the gate voltage control circuit includes the same number of the resistors and switching circuits as the bit number of the current control signal.

6. The current mode output driver of claim 3, wherein:
the plurality of switching circuits are NMOS transistors;
drains and sources of the NMOS transistors are connected to the plurality of resistors, respectively; and
the current control signal is input into gates of the NMOS transistors.

7. The current mode output driver of claim 3, wherein the gate voltage control circuit comprises:

a reference current source circuit which generates a predetermined reference current;

a first current source circuit which forms a current mirror with the reference current source circuit, which generates a first predetermined current, and which outputs the first predetermined current to an output node;

an additional current source circuit which is connected in parallel to the first current source circuit, which forms a current mirror with the reference current source circuit, which generates a predetermined additional current in response to the current control signal, and which outputs the predetermined additional current to the output node; and a resistor which passes a whole current flowing to the output node and which generates a predetermined level of gate voltage on the output node, wherein the whole current is a sum of the first current and the additional current.

8. The current mode output driver of claim 7, wherein the additional current source circuit comprises:

additional current sources which generate a plurality of additional currents, each increased by a predetermined multiple of the reference current; and a plurality of switching circuits, each of which is turned on or off in response to the current control signal and outputs the additional currents to the output node when turned on.

9. The current mode output driver of claim 8, wherein:
the additional current sources are PMOS transistors for driving the plurality of additional currents, and
the plurality of switching circuits are NMOS transistors, wherein:

the drains of the NMOS transistors are connected to drains of the PMOS transistors, respectively;

sources of the NMOS transistors are connected to the output node; and the current control signal is input into the gates of the NMOS transistors.

10. The current mode output driver of claim 8, wherein the gate voltage control circuit includes the same number of the additional current sources and the switching circuits as the bit number of the current control signal.

11. A method of controlling an output current from a current mode output driver, the current mode output driver including a gate voltage control circuit which changes a level of a gate voltage according to a value of a current control signal and outputs the changed result; a bias circuit which outputs the gate voltage as a first enable signal in an active mode and outputs a ground voltage as a second enable signal in a standby mode; and a driver circuit which drives a predetermined output current in response to the first enable signal and stops its operation in response to the second enable signal, the method comprising:

increasing the level of the gate voltage and outputting the increased result when the value of the current control signal increases in the active mode, at the gate voltage control circuit;

increasing an output current driven by the driver circuit due to decrease of a turn-on resistance of the driver circuit according to an increase of the level of the gate voltage;

decreasing the level of the gate voltage and outputting the decreased result when the value of the current control signal decreases in the active mode, at the gate voltage control circuit; and decreasing the output current driven by the driver circuit due to an increase of the turn-on resistance of the driver circuit according to decrease of the level of the gate voltage.

* * * * *